United States Patent [19]

Myer

[11] Patent Number: 5,032,798
[45] Date of Patent: Jul. 16, 1991

[54] CAVITY MEANS FOR MICROWAVE DIVIDER-COMBINER UNITS

[75] Inventor: Robert E. Myer, Denville, N.J.

[73] Assignee: AT&T Bell Laboratories, Murray Hill, N.J.

[21] Appl. No.: 472,160

[22] Filed: Jan. 30, 1990

[51] Int. Cl.$^5$ .............................. H03F 3/68; H03F 3/60
[52] U.S. Cl. ...................................... 330/295; 330/286; 333/137
[58] Field of Search ................. 330/53, 56, 84, 124 D, 330/124 R, 286, 295; 333/125, 136, 137

[56] References Cited

U.S. PATENT DOCUMENTS 4,641,107 2/1987 Kalokitis .......................... 330/295 X
4,724,400 2/1988 Luettgenau ......................... 330/295

Primary Examiner—Steven Mottola
Attorney, Agent, or Firm—R. F. Kip, Jr.

[57] ABSTRACT

There is disclosed a cavity closure unit for a microwave amplifier containing smaller and larger diameter, upper and lower, divider and combiner cavities on vertically opposite sides of a central part of such unit and disposed between top and bottom parts, respectively, of such unit, each cavity being bounded on a vertical side thereof by an alternation of concentric ridges and valleys. Improvements for such unit are as follows. The central part includes a discontinuity between upper and lower portions which may be a spatial discontinuity permitting removal from each other of the two cavities. The discontinuity may also be one of materials. The closure unit may have below its top, an outside annular notch of "L" vertical cross section providing a seat for downwardly extending feet on the rear ends of amplifier modules mounted in carousel fashion on top of the unit. The mentioned central part may comprise two sheet metal plates, two claddings of metallic material on a plastic disc, or two composite discs each including such a plate or cladding, a plastic backing therefor, and a metal reinforcing plate. For the structures referred to in the preceding sentence, the mentioned ridges and valleys are produced by appropriately inflecting the sheet metal plates or claddings, as the case may be.

42 Claims, 11 Drawing Sheets

CAVITY MEANS FOR MICROWAVE DIVIDER-COMBINER UNITS

TECHNICAL FIELD

This invention relates generally to apparatus in which electromagnetic microwave energy is distributed via a divider cavity to a plurality of amplifiers, and is then amplified in parallel by these amplifiers, and in which the separate outputs from these amplifiers are then merged via a combiner cavity to provide a single amplified output of such energy from such apparatus. More particularly, this invention relates to improvements in such cavities, in the closure means therefor and in the means for connecting the amplifiers to such cavities.

BACKGROUND OF THE INVENTION

On Feb. 9, 1988, U.S. Pat. No. 4,724,400, entitled "Linear Amplifier" was issued in the name of G. G. Luettgenau to TRW Inc. (the "400 patent"). Such patent is treated herein solely as a publication.

The '400 patent shows and describes a microwave splitter-combiner apparatus comprising a cylindrical stack of vertically superposed circular metallic plates defining within the stack an upper divider waveguide or cavity and a lower combiner waveguide or cavity. Each such cavity comprises a pair of vertically spaced metallic walls and a chamber between and bounded by such walls and providing a passage through which microwaves propagate, the chamber being essentially in the form of a horizontal cylindrical disc. In the divider waveguide, the microwaves travel through its cylindrical disc chamber from its center radially outward while, in the combiner waveguide, such travel in its chamber is radially inward towards the center of the chamber. Both of the cavities have metallic wall portions bounding the cavity in which are concentric ridges and valleys formed by milling of a thick plate providing that wall surface.

Disposed on a plate member providing a top closure for the mentioned stack is a set of twenty r.f. amplifier operating units. The twenty units are equiangularly spaced in carousel fashion around the top of such member in respective radial planes which are vertical and pass through the vertical axis of the stack.

Each of such twenty r.f. amplifier units is coupled to the splitter waveguide by an input coaxial connector and to the combiner waveguide by an output coaxial connector. In the operation of the apparatus, high frequency electromagnetic energy is fed to the splitter waveguide's center, travels therefrom radially outward through the waveguide's chamber to the twenty input connectors and is then fed upward by them to the twenty amplifiers which operate in parallel to amplify such energy. The amplified energy is then fed via the twenty output connectors to points in the combiner waveguide's chamber which are radially outward of the chamber's center. From those points the energy travels as waves radially inward through the chamber to its center to there be combined and provide an amplified output from the apparatus.

In the apparatus of the '400 patent, the divider and combiner cavities have between them a single intermediate plate constituted of metal which is continuous in the plate's thickness dimension from the plate's surface bounding the divider cavity to the plate's surface bounding the combiner cavity.

SUMMARY OF THE INVENTION

In contrast, a splitter-combiner apparatus, according to the present invention in one of its aspects, is characterized by the improvement of the incorporation in the central wall means between the two cavities of a discontinuity between two metallic wall portions of such wall means which respectively bound the upper and lower ones of such cavities, and which are rendered non-integral by such discontinuity. The providing of such discontinuity affords various advantages to be gained over the apparatus of the '400 patent in dependence on how the discontinuity is provided. For example, the mentioned central wall means may comprise two separate vertically superposed plates having a spatial discontinuity therebetween and, in such case, the cavity closure assemblage may be designed so that the two cavities can be physically removed from each other to enable them to be tested separately. Also in such case, those two plates may be constituted of relatively thin sheet metal in which the mentioned ridges and valleys are formed by stamping or other machine working so as, thereby, to avoid the large expense of forming such ridges and valleys by milling thick plates.

As another example of the use of such a discontinuity, the mentioned central wall means may comprise a molded plastic disc and metal claddings on the upper and lower sides of the disc and providing the metallic wall portions of such central wall means which bound the two cavities. In that latter case, the mentioned ridges and valleys may be formed in such metallic wall portions by an appropriate mold design of the disc, and those portions are separated by a discontinuity provided by the plastic disc material rather than by any spatial discontinuity interposed in the clad disc between its top and bottom sides.

BRIEF DESCRIPTION OF THE DRAWING

For a better understanding of the invention, reference is made to the following description of representative embodiments thereof, and to the accompanying drawings wherein.

DETAILED DESCRIPTION

Figure 1:
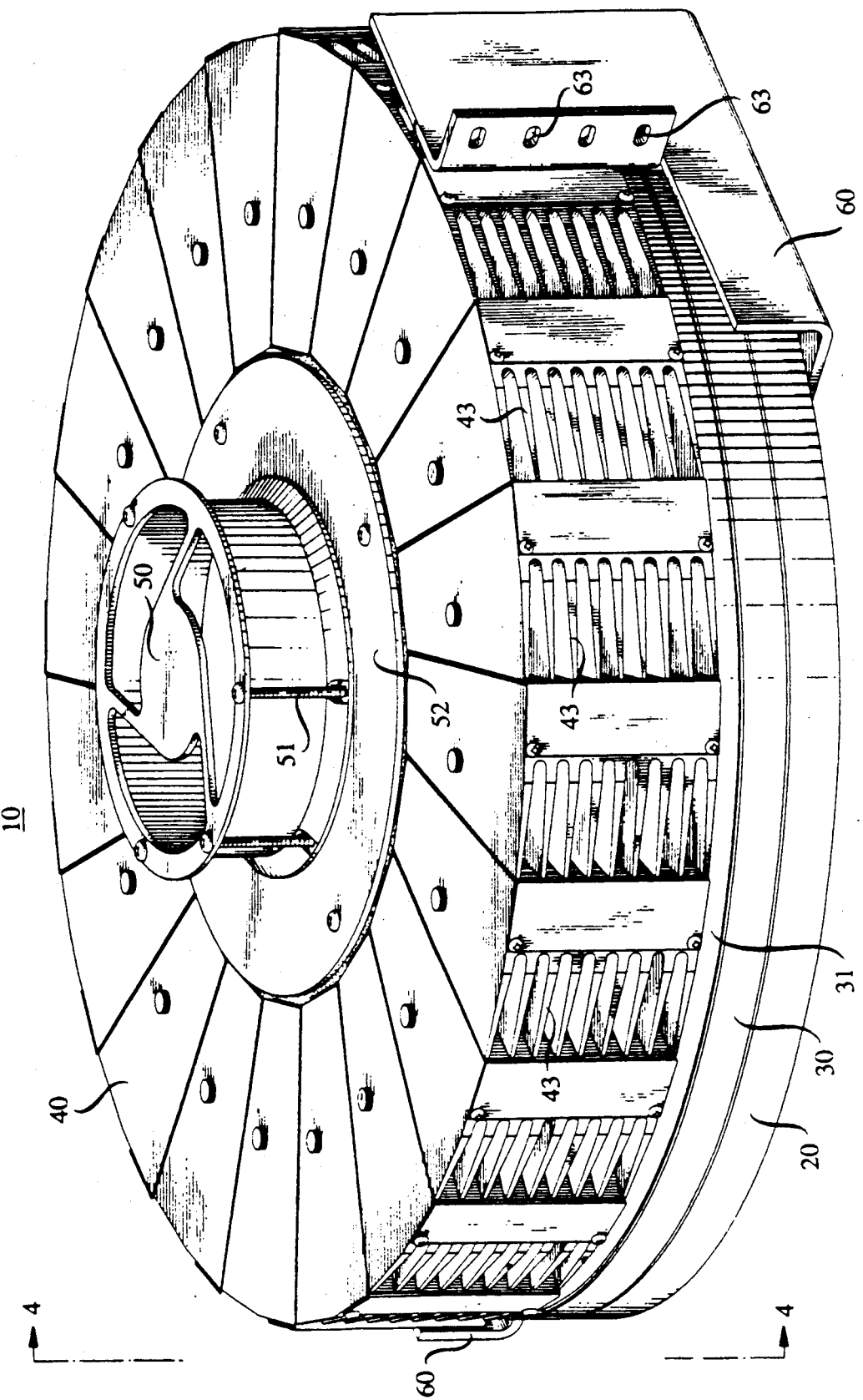
FIG. 1 is a perspective view of a microwave divider-combiner apparatus of a type to which the invention relates.

FIG. 1 is a perspective view of an assembled apparatus in the form of a power amplifier generally denoted as 10 in which radial power divider cavity 30 is stacked on radial power combiner cavity 20 so that both are axially aligned. It is to be understood, however, that other stacking arrangements may be used. For example, divider cavity 30 may be placed beneath combiner cavity 20 so that the input and output connections of the amplifier structure are reversed. Amplifier 10 as shown is operative over the frequency range between 869 MHz and 896 MHz useful in cellular telephone systems. It is to be understood however that the dimensions and shape of amplifier 10 may be adapted to operate over other frequency ranges. Wedge shaped amplifier modules 40 are disposed in radial fashion around the outer portion of the top cover plate 31 of radial power divider cavity 30. Each amplifier structure 40 includes a set of horizontal wedge shaped cooling fins 43 extending from each housing structure 40. Power supply connections to the amplifier device modules are not shown but can be readily placed on the top end of the amplifier device modules. Fan housing 50 is mounted above the central portion of divider cavity 30 on ring shaped plate 52. The fan in housing 50 forces ambient air across the horizontal fins 43 to remove heat from amplifier structures 40. As is readily seen, insertion and removal of amplifier housings 40 is completely independent of the air flow arrangements. Brackets 60 arranged on two sides of power amplifier 10 are attached to the bottom of combiner cavity 20 and have mounting holes 63 for attachment of amplifier assembly 10 to a frame not shown. While bracket mounting structures are shown in FIG. 1, it is to be understood that other mounting structures well known in the art may be used.

Figure 2:
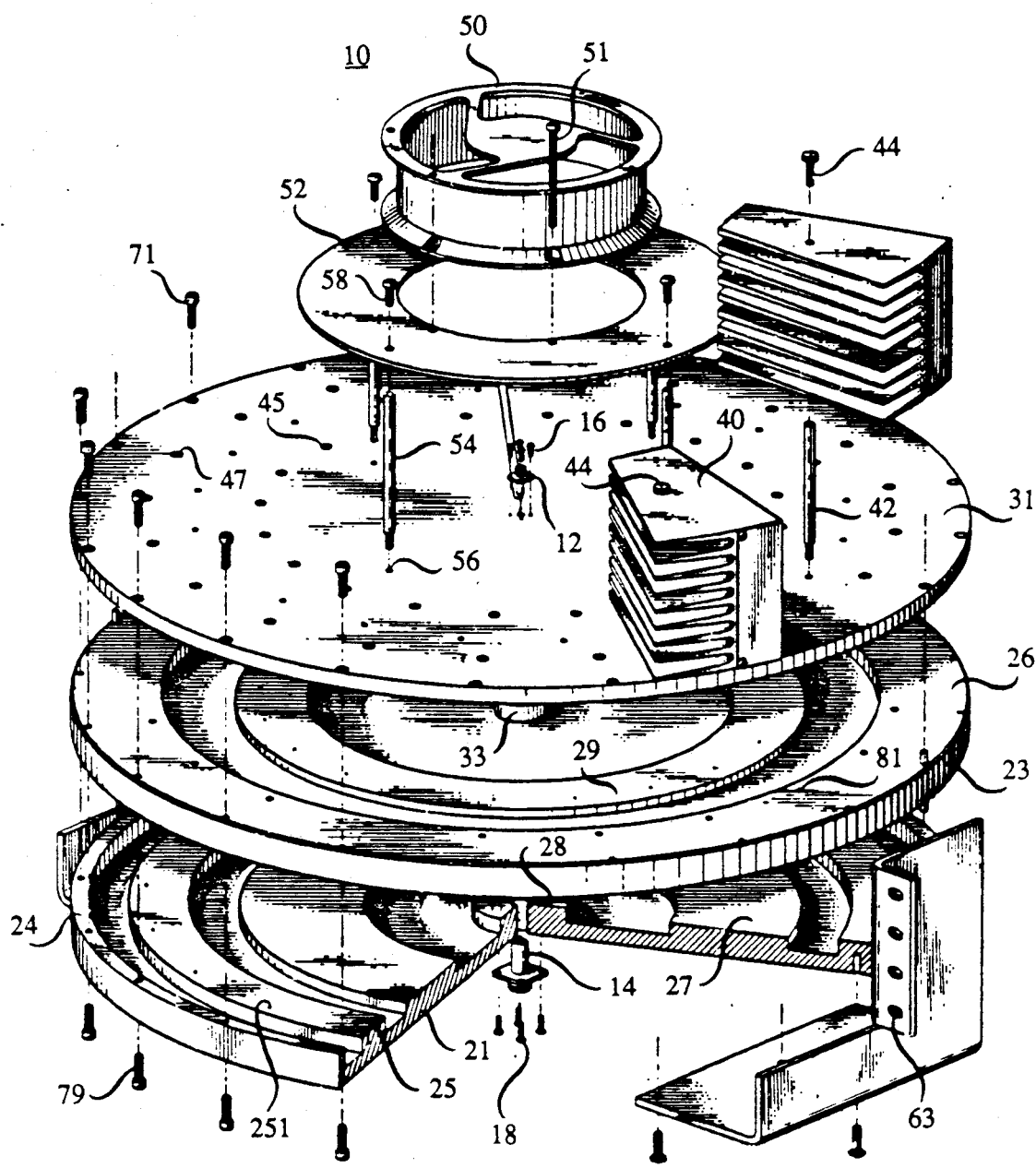
FIG. 2 is an exploded view of the apparatus shown in FIG. 1.

FIG. 2 is an exploded perspective view of amplifier structure 10. As shown in FIG. 2, combiner cavity 20 comprises circular bottom plate 21, the lower side of circular control plate 23 and outer cylindrical wall 24 extending peripherally upward from plate 21. The lower side of plate 23 is flat while the upper side of plate 21 includes a series of concentric ridges 25, 27 and 28. The ridges and valleys between plates 21 and 23 provide the electrical characteristics of combiner cavity 20. In particular, the narrow regions in the cavity formed between the ridges of circular plate 21 and the bottom of plate 23 correspond to capacitive elements while the wider regions in the cavity in between the ridges of plate 21 correspond to inductive elements. Similarly, divider cavity 30 comprises the upper side of circular plate 23, the lower side of flat circular cover plate 31 and outer cylindrical wall 26 extending upward from plate 23. Ridges 29 and 33 on the upper portion of plate 23 correspond to a capacitive elements so that the prescribed electrical transmission characteristics are obtained. Although control plate 23 serves as the upper closure plate of cavity 20 and the lower closure plate of cavity 30, it is to be understood that the plate structure between the two cavities may comprise two separate plates as will be later described in more detail.

Circular plates 21, 23 and 31 are axially aligned and have the same diameter. Plate 31 is secured to the upper side of plate 23 by bolts 71 threaded into outer cylindrical wall 26 of plate 23 so that divider cavity 30 is formed. Plate 21 is secured to the lower side of plate 23 by threading bolts 79 into the periphery of plate 23 through outer cylindrical wall 24 of plate 21 whereby combiner cavity 20 is formed. Upper plate 31 of the divider cavity includes a set of apertures 45 arranged in a circular pattern for insertion of the input coaxial connector units of amplifying device modules 40 and a set of apertures 47 arranged in a circular pattern for insertion of the output coaxial connector units of amplifying device modules 40. Apertures 45 are circularly disposed at a first radial distance from a central port for plate 31 and apertures 47 are circularly disposed at a second radial distance greater than the first distance from such central port. While shown as having the second distance greater than the first distance, it is to be understood that the second distance may be smaller than the first distance so that input termination apertures are at a greater distance from the plate center than the output termination apertures.

Each aperture 45 is lined up radially with a corresponding aperture 47 for placement of one amplifying device module 40 on top of cover plate 31. While in position on upper plate 31, each amplifying device module 40 is secured thereto by a rod 42 passing through its horizontal fin structure 43 into plate 31 and bolt 44 threaded into the top of rod 42. Fan structure 50 is mounted on plate 52 by bolts 51 and is spaced from the upper surface of plate 31 by rods 54. These rods are threaded into apertures 56 in plate 31. Plate 52 is secured to the rods by bolts 58. The mounting of the amplifying device modules on plate 31 permits an efficient and economical heat transfer structure for the amplifier while permitting easy insertion and removal of individual modules.

A signal to be amplified is applied to coaxial connection device 12 in FIG. 2 which is affixed to the central port of divider cavity plate 31 by bolts 16. Coaxial connection device 14 attached to the central port of plate 21 of combiner cavity 20 by bolts 18 is adapted to transfer the combined amplified signals to a load.

Figure 4:
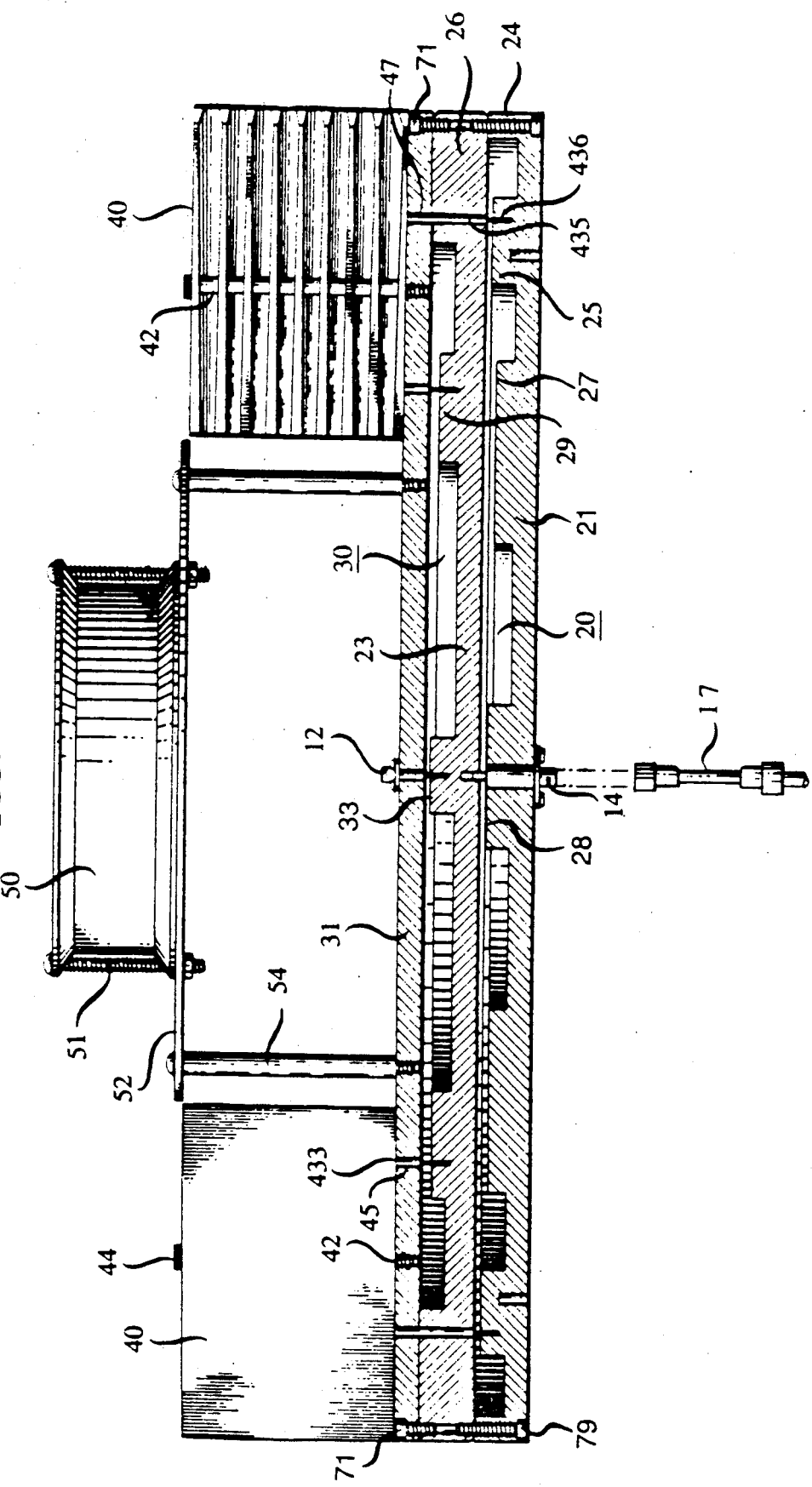
FIG. 4 is an elevation view of the apparatus of FIG. 1 through section 4—4 showing the interconnections between the power divider cavity, the amplifying device module and the power combiner cavity.

FIG. 4 depicts a cross section of amplifier structure 10 including amplifying device modules 40, divider cavity 30 and combiner cavity 20 along lines 4—4 in FIG. 1. Referring to FIG. 4, input signal energy enters the central port of divider cavity 30 through connection 12 in plate 31 and flows radially outward. Each amplifying device 40 has a coaxial input coupler 433 extending into divider cavity 30 through aperture 45. The outer conductor of coaxial input coupler 433 is in slidable contact with aperture 45 in plate 31 but does not extend into cavity 30. The center conductor of coupler 433 extends through cavity 30 and is in contact with the upper side of plate 23.

Amplifying device 40 may comprise a semiconductor circuit such as described in "Microwave Transistor Amplifiers Design and Analysis" by Guillermo Gonzalez, Prentice Hall, Inc., Englewood Cliffs, N.J. 1984. The output signal of amplifying device 40 appears on coaxial output coupler 435. The outer conductor of coupler 435 extends through aperture 47 and through a passageway in outer wall 26 of cavity 30 and plate 23 aligned therewith so that center conductor 436 of output coupler 435 passes through cavity 20 and contacts ridge 25. Combiner cavity 20 receives the output signal energy of each amplifying device 40 at ridge 25. The signal energy received by the combiner cavity from amplifying devices 40 flows radially inward toward coaxial connection device 14 which may be connected to a load such as an antenna via a cable not shown.

Figure 3:
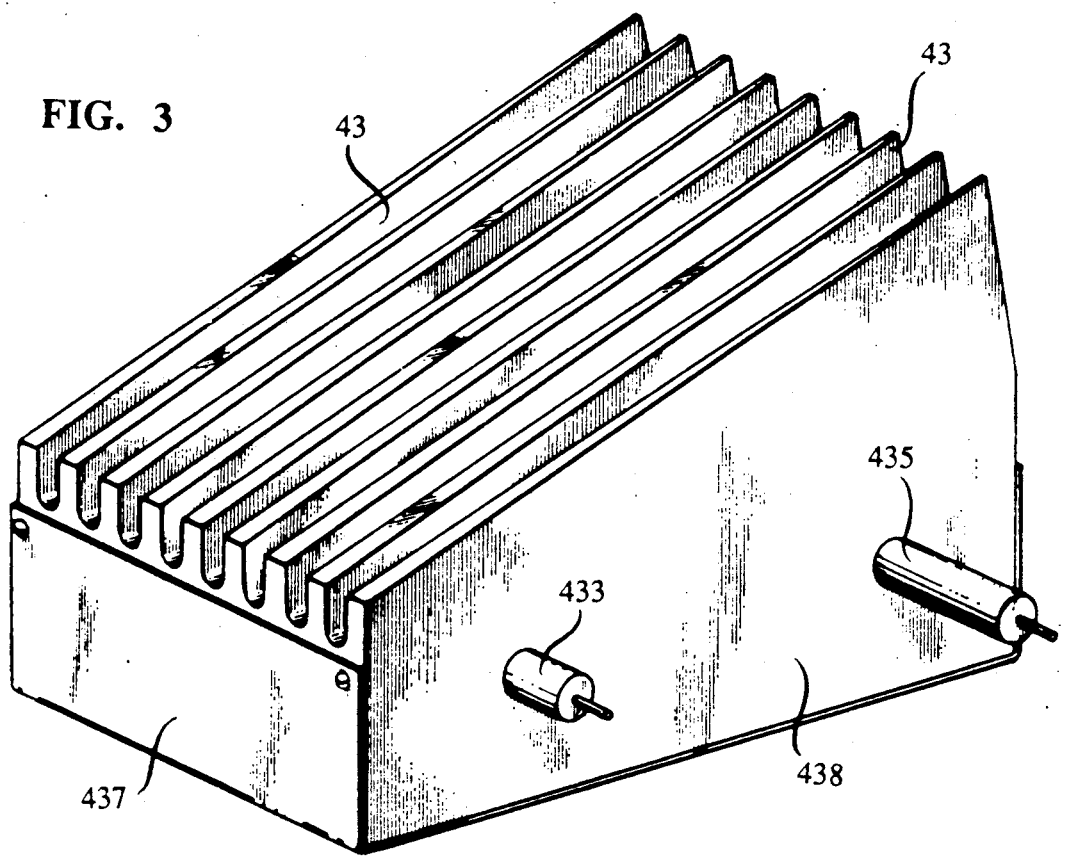
FIG. 3 is a perspective view of the housing of an amplifying device module of FIG. 1.

The wedge shaped housing structure of amplifying device module 40 is shown in greater detail in FIG. 3. Referring to FIG. 3, the electronic components comprising the amplifying device are contained in the interior of the housing within the width of side 437 while fins 43 extend from one side of the housing. Side 438 of the housing which is adapted to be placed on plate 31 as shown in FIG. 2 includes mounting arrangements for input coaxial extension 433 and output coaxial extension 435. Coaxial extension 433 is connected to the input of the amplifying device and coaxial extension 435 is connected to the output of the amplifying device. Coaxial couplers 433 and 435 both extend from one side of the housing and are spaced to fit into a corresponding set of apertures 45 and 47, respectively, along a radial line in FIG. 1. In FIG. 4 the closure structure for divider cavity 30 has the same outside diameter as the closure structure for combiner cavity 20 but its outer peripheral closure wall 26 is thicker than the peripheral closure wall beneath it for the combiner cavity 20. Input coupler 433 is relatively short so that it is slidably insertable into divider cavity 30 via an aperture 45 and output coupler 435 is relatively long so that it extends through the passageway including the corresponding aperture 47 in plate 31, outer cylindrical wall 26 of cavity 30 and plate 23 into cavity 20.

Coupler 433 is located closer to the narrow edge of side 438 (FIG. 3) and is inserted into an aperture 45 in the outer portion of divider cavity 30 while coupler 435 is located nearer the wider edge of side 438 so that it is inserted into aperture 47 and through the outer cylindrical wall of cavity 30 into the outer portion of combiner cavity 20. As aforementioned, the positions of couplers 433 and 435 may be reversed where more convenient. The center conductor of input coupler 433 extends through divider cavity 30 to receive signal energy therefrom while the outer conductor of input coupler 433 slides into aperture 45 but does not protrude into the divider cavity. The outer conductor of output coupler 435 extends through the cylindrical wall of plate 31 of divider cavity 30 into cylindrical wall 26 of plate 23 but does not extend into cavity 20. The center conductor of coupler 435 passes through cavity 20 at ridge 25 to provide efficient signal coupling into the combiner cavity. It is to be understood that other arrangements for entering combiner cavity 20 may be used which will be later described in more detail.

The structures of coaxial connector units 433 and 435 and the particular details of such structures may be as disclosed in co-pending U.S. patent application Ser. No. 07/401,364 filed Aug. 31, 1989 in the name of E. V. Bacher and R. E. Myer for "Coaxial Wave Guide Coupling Assemblages", such application being assigned to the assignee hereof and being incorporated herein by reference and made a part hereof.

Amplifying device 40 is mounted on plate 31 of divider cavity 30 by holding device 40 in a raised position over that plate and aligning the input and output couplers along the radial line through the pair of apertures 45 and 47 therealong. Input coupler 433 is placed above aperture 45 and output coupler 435 is placed above aperture 47. A guide rod 42 has previously been threaded into plate 31 to stand upright therefrom, and device 40 in its raised position is disposed above that rod. The amplifying device is slid from such raised position down on rod 42 such that the rod passes relatively upwards through receptacle holes therefor in the amplifier fins 43. The device 40 is then secured by tightening nut 44 onto the threaded top section of the rod 42. Amplifying device removal is accomplished by reversing these steps.

Figure 7:
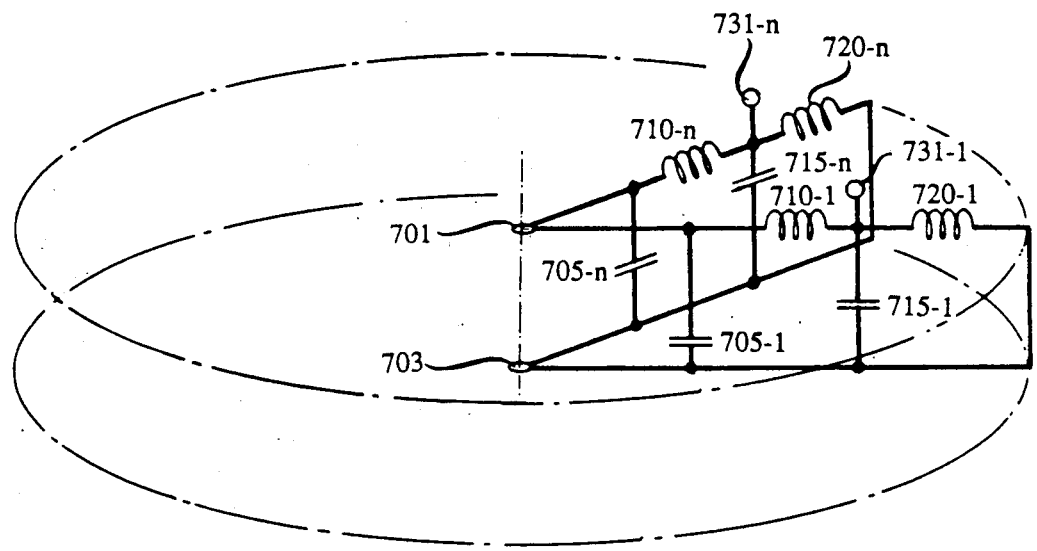
FIG. 7 is a circuit diagram showing an electrical equivalent circuit illustrating the effect of the divider cavity of FIG. 1.

FIG. 7 shows an electrical equivalent circuit for divider cavity 30 in which the narrow sections in the cavity above the ridges in plate 23 are represented as capacitor elements and the wide sections intermediate the ridges are represented as inductive elements. As illustrated in FIG. 7, the input signal is applied to points 701 and 703 which correspond to the center of the cavity through input connection 12 (FIG. 2). The signal energy spreads as it travels radially outward so that a portion of the energy is available to each amplifying device input coupler. An input coaxial coupler is connected to point 731—1 for one amplifying device. Another input coaxial coupler is connected to point 731—n and couplers are connected to points 731—2 through 731—n—1 for amplifying devices therebetween with networks not shown. For n amplifying devices each with an input impedance of 50 ohms, the resulting impedance of the n units connected in parallel is 50/n ohms. The ridge arrangement of cavity 30 between the lower portion of plate 31 and the upper portion of plate 23 provides an impedance network well known in the art so that a load impedance of 50 ohms is presented between points 701 and 703 to connection 12 and a source impedance of 50 ohms is presented to each amplifying device at its input point 731—n in the frequency range of interest.

The equivalent circuit for one amplifying device, in cavity 30 shown in FIG. 7 comprises capacitors 705—1 and 715—1 corresponding to ridges 33 and 29 in FIGS. 2 and 4 and inductances 710—1 and 720—1 corresponding to the valley portions between these ridges.

Figure 8:
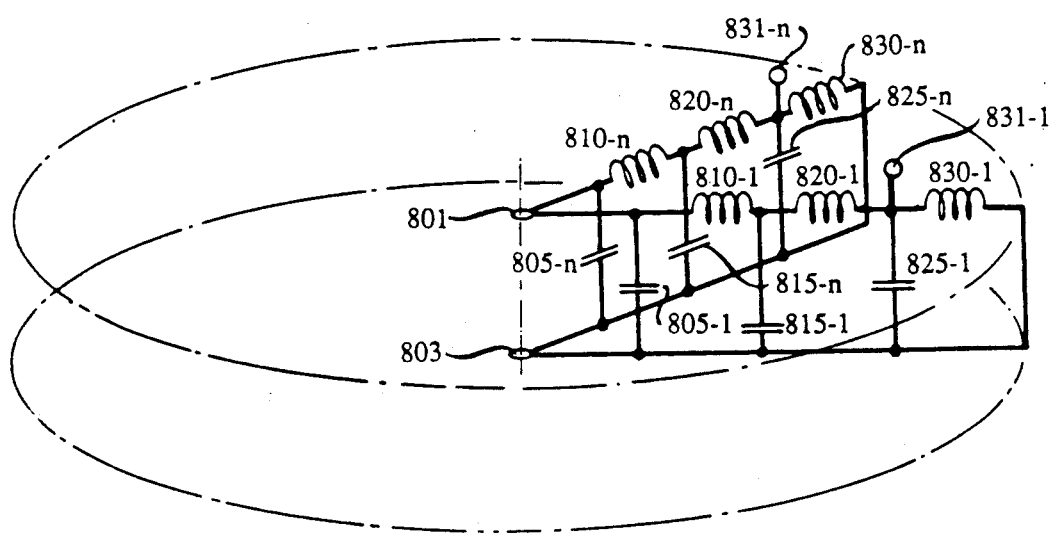
FIG. 8 is a circuit diagram showing an electrical equivalent circuit illustrating the effect of the combiner cavity of FIG. 1.

FIG. 8 shows an electrical equivalent circuit for combiner cavity 20 which combines the amplified signal energy from the amplifying device output couplers. The output of amplifying devices 40 are applied to points 831—1 through 831—n, respectively. These points correspond to apertures 47 on the outer portion of the stacked cavities. An output coupler is connected to point 831—1. Another output coupler is connected to point 831—n and couplers are connected to similar points for amplifying devices therebetween with networks not shown. For n amplifying devices each with an output impedance of 50 ohms, the resulting impedance of the amplifying device outputs connected in parallel absent the combiner cavity is 50/n ohms. The ridge arrangement between the lower portion of plate 23 and the upper portion of plate 21 provides an impedance matching network so that a source impedance of 50 ohms is presented between points 801 and 803 to output connection 14 and a load impedance of 50 ohms is presented to each amplifying device at its input point 831—n. The equivalent circuit for one amplifying device, in cavity 20 shown in FIG. 8, comprises capacitors 805—1, 815—1 and 825—1 corresponding to portions of ridges 28, 27, and 25 and inductances 810—1, 820—1 and 830—1 corresponding to the valleys between these ridges. For another amplifying device, capacitors 805—n, 815—n, and 825—n and inductors 810—n, 820—n and 830—n are formed from the associated portions of the ridges and valleys therebetween.

The number of amplifying devices inserted into the divider and combiner cavities may vary from one to the number required to fill the outer portion of plate 31. The parameters of the divider and combiner cavities, however, are fixed for a prescribed number of amplifying devices. In the event that fewer devices are inserted, there is an impedance mismatch at the input and output ports of the radial cavities. While the mismatch at the input port of divider cavity causes little variation in the amplifier gain over the desired frequency range, the mismatch at the output port is significant. An impedance matching stub well known in the art at the output port such as ¼ wave stub 17 in FIG. 4 may be used to compensate for such output port mismatch. The parameters of the stub are a function of the number of amplifying devices used. For example, if half of the amplifying devices are plugged into the divider and combiner cavities, a matching stub of 70.7Ω is required.

Figure 5:
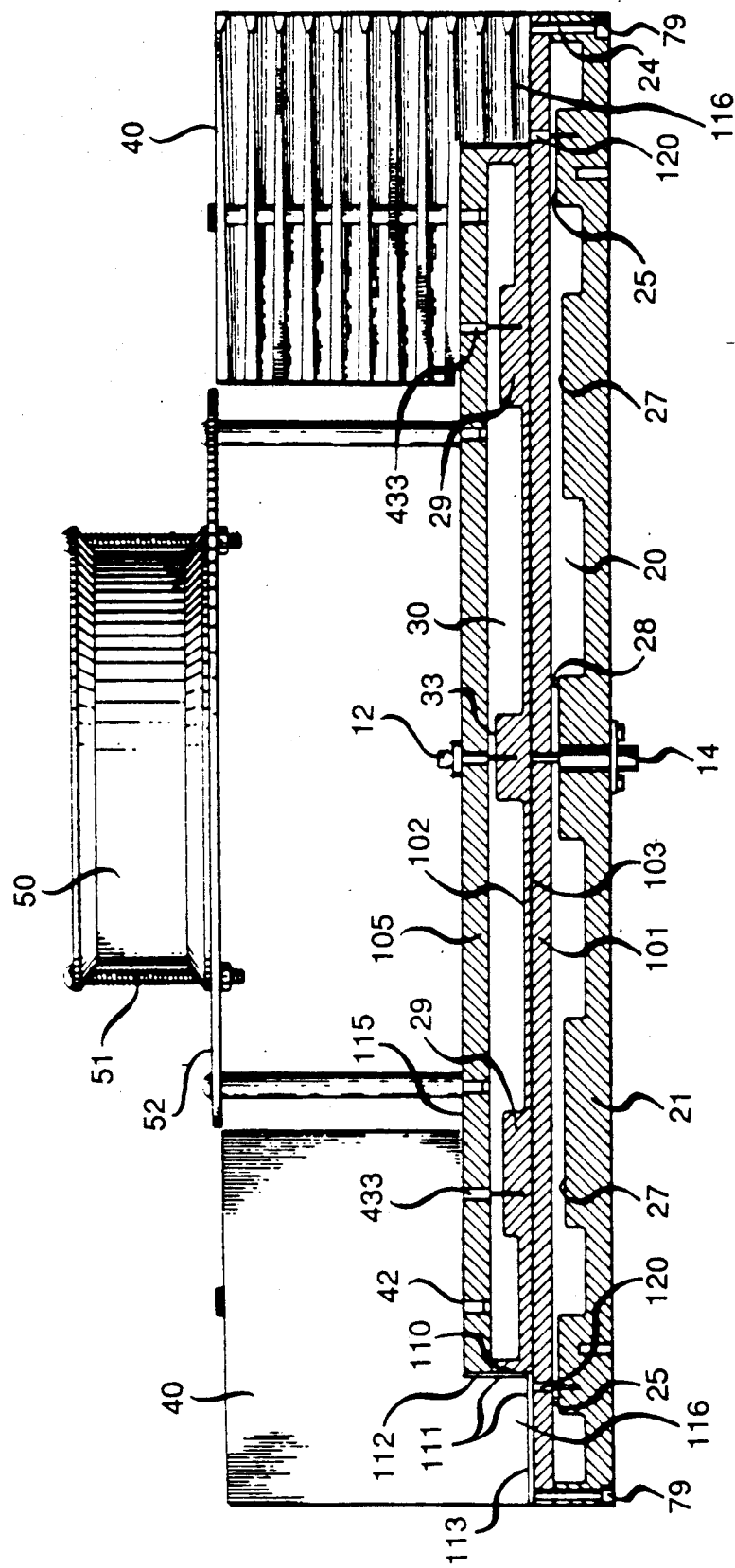
FIG. 5 is an enlarged view of a first modification of the cavity closure means of the FIG. 1 apparatus.

Referring now to the FIG. 5 modification, the shown cavity closure means comprises vertically spaced top and bottom wall means and central wall means therebetween. Upper divider cavity 30 and lower combiner cavity 20 are vertically interposed between such central wall means and, respectively, such top wall means and such bottom wall means.

The bottom wall means is the same metallic end plate 21 as is shown in FIG. 4. The central wall means of FIG. 5 differs, however, from that of FIG. 4 in that the single plate 23 of FIG. 4 is replaced by two vertically superposed metallic plates, namely, a lower intermediate plate 101 and an upper intermediate plate 102. As shown, plates 101 and 102 are in contiguous back-to-back relation with each other, and are on vertically opposite sides of a horizontally extending spatial discontinuity 103 between the two plates. Because of such discontinuity, plates 101 and 102 are non-integral with each other.

Plate 101 is a flat circular metallic plate coaxial, and of the same diameter as, plate 21. The two plates 21 and 101 are fastened together by the bolts 79 which pass up through the outer upstanding flange wall 24 provided by plate 21, and into threaded holes in plate 101. The configuration provided by plates 21 and 101 for cavity 20 is the same as such cavity has in FIG. 4.

Plate 102 at its thickest places is thicker than plate 104 and has been milled to incorporate therein the same alternation of concentric ridges 29, 33 and valleys therebetween as characterizes the plate 23 in FIG. 4. Those ridges and valleys of plate 102 are spaced across divider cavity 30 from the top wall means consisting in FIG. 5 of a flat circular metallic upper end plate 105. Plate 105 is the same as plate 31 of FIG. 4 to the extent that both plates on their underside have a flat surface spaced by the same distance away from the ridges 29 and 33. Thus the cavity 30 has the same configuration in FIG. 5 as it does in FIG. 4.

The embodiments of FIG. 4 and FIG. 5 differ in at least the following respects in addition to providing in FIG. 5 the elements 101, 102, 103. First, the radially thick outer wall 26 of the center plate 23 of FIG. 4 is replaced by a radially much thinner vertically upstanding flange 110 extending in FIG. 5 around the periphery of the plate 102. Due to the radial thinness of that flange, plate 102 is of smaller diameter than the lowermost plate 21. Second, the upper end plate 105 is (as compared to plate 31 of FIG. 4) made smaller in diameter than plate 21 to match in diameter that of plate 102.

Because of those differences, the exterior of the FIG. 5 cavity closure means is characterized by an annular indentation 111 extending around the periphery of such closure means below its top and in the form of a notch which is generally of "L" shape in cross section in vertical radial planes through the vertical axis of the FIG. 5 assembly. Notch 111 is bounded on its inner sides by the vertical cylindrical outer surface 112 of flange 110 and by a radially outer annular surface portion 113 of the horizontal upper surface of lower intermediate plate 101. Such surface portion 113 is left uncovered by virtue of the fact that plate 102 is of smaller diameter than plate 101.

In FIG. 5 (as in FIG. 4), the radially front ends of the amplifier modules 40 overlie the top of the cavity closure means and are seated on the top of its uppermost plate. In FIG. 5, however, the housings of the amplifier modules are shaped at the radially rear ends of the modules to have feet 116 overlying the bottom face 113 of notch 111 and projecting down into notch 111 to be seated on such bottom face. The modules are coupled to the lower combiner cavity 20 by coaxial connector units 120 which have structures of the kind disclosed in the aforementioned Bacher et al application, and which are counterparts of the output couplers 435 shown in FIG. 4. The connector units 120 are disposed in the horizontal direction radially outward of the outer surface 112 of the peripheral wall provided by flange 110 extending around upper cavity 30. In the vertical direction, units 120 extend from the bottoms of the amplifier module feet 116 down through apertures in the lower intermediate plate 101 to cavity 20, the inner conductors of such units passing through such cavity.

By virtue of the amplifier modules 40 having the described feet 116, more space is made within the module housings of such units for the accommodation of whatever is desired to be put therein. Further, by virtue of the output connector units 120 of the modules extending downward from the bottom of their feet 116 rather than from parts of the modules vertically at the same level as the top of the cavity closure means, the connectors 120 of FIG. 5 may be made much shorter than their counterparts 435 shown in FIG. 4. Hence, such connectors 120 can be provided less expensively than such counterparts and are less likely to be subject to misalignment problems in the course of attempting to pass the connector units down into cavity 20.

Upper end plate 105 may be fastened to upper intermediate plate 102 by a first set of bolts (not shown) spaced equiangularly around those plates and passing vertically through holes in plate 105 into threaded holes in the flange 110 in plate 102. The assembly of plates 105 and 102 may be fastened to the assembly of plates 101 and 21 by a second set of bolts (not shown) spaced equiangularly around the plates 105, 102 in interspersed relation with such first set of bolts, and passing vertically down through holes in plate 105 and through holes in flange 110 of plate 102 all the way through that flange into threaded holes in plate 101. By retracting that second set of bolts, the upper assembly of plates 105, 102 may be removed from the lower assembly of plates 101, 21 with the cavities 20 and 30 remaining intact to permit separate testing thereof. Such nondestructive parting of those cavities from each other is made possible by the feature among others of the presence of the discontinuity 103 in the FIG. 5 cavity closure means.

Figure 6:
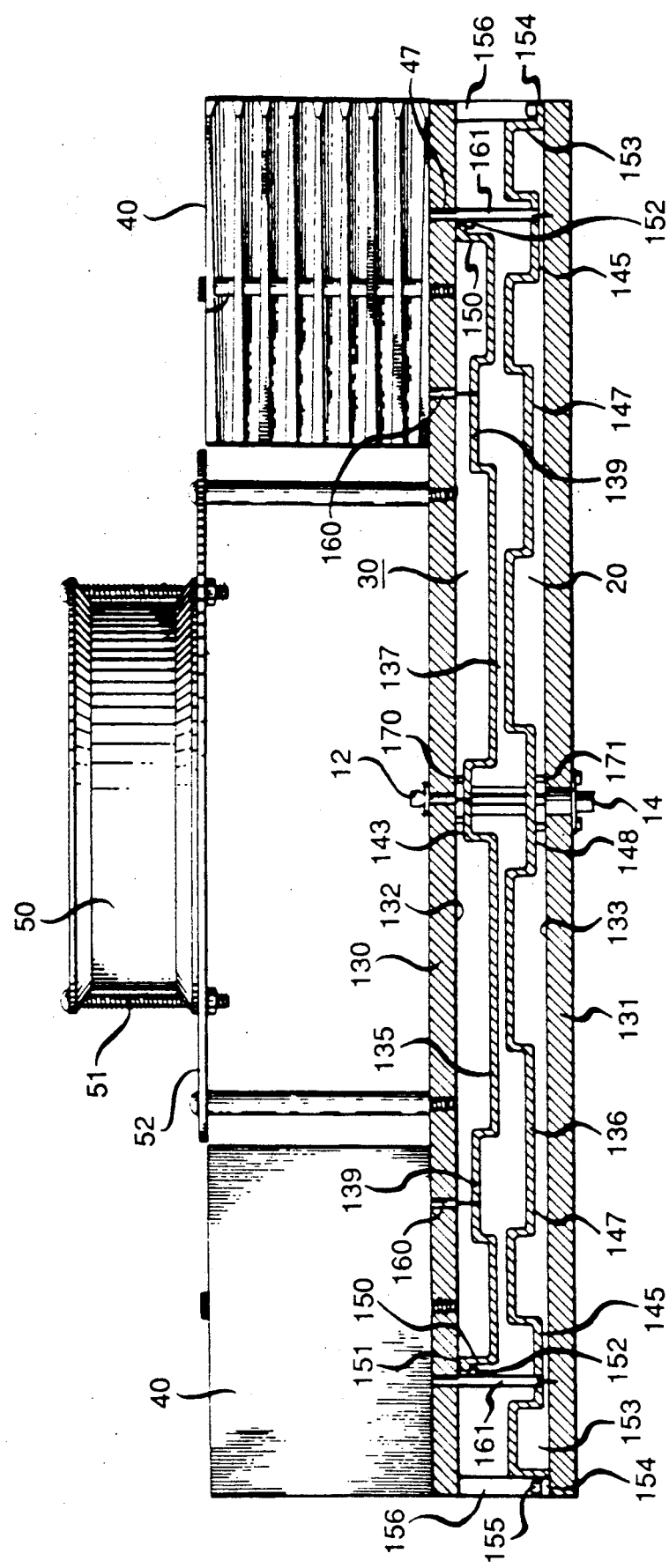
FIG. 6 is an enlarged view of a second modification of the cavity closure means of the FIG. 1 apparatus.

In the modification shown by FIG. 6 of the FIG. 4 embodiment, the top and bottom wall means of the cavity closure structure are respectively provided by two flat circular metallic end plates 130 and 131. Top end plate 130 at its lower surface 132 provides a metallic wall portion bounding the upper side of divider cavity 30. Similarly, bottom end plate 131 at its upper surface 132 provides a metallic wall portion 133 bounding the lower side of combiner cavity 30.

In FIG. 6, the central wall means of the cavity closure means comprises upper and lower intermediate plates 135 and 136 which are constituted of sheet metal and are on vertical opposite sides of a spatial discontinuity 137 between the plates. Those plates 135, 136 provide metallic wall portions bounding respectively the cavities 30 and 20. In FIG. 6 the discontinuity 137 is shown as being a spatial gap existing between the plates for the full horizontal extend thereof. If, desired however, plates 135 and 136 may be in contiguous back-to-back relation such that portions of the two plates are in contact with each other. Moreover, if the discontinuity is not needed for the purpose, say, of permitting parting from each other and subsequent separate testing of the cavities 20 and 30, plates 135 and 136 may be welded or otherwise united with each other.

The sheet metal plates 135 and 136 are thin as compared, for example, to the end plates 130 and 131. Because of such thin character of the plates 135 and 136, they each constitute a horizontally extending laminate body of metallic material of constant-thickness between opposite outer sides of such material and walling, respectively, the lower side of cavity 30 in the case of plate 135 and the upper side of cavity 20 in the case of plate 136.

The sheet metal plates are shaped by stamping or other machine working to each have an alternation therein of concentric ridges and valleys. Specifically, plate 135 has annular bends or flexures therein forming in such plate the ridges 139 and 143 which face toward the interior of the upper cavity 30, and which dimensionally correspond (along with the valleys between the ridges) to the ridges 29 and 33 of FIG. 4. Similarly, plate 136 has annular bends or flexures therein forming in the latter plate the ridges 145, 147 and 148 which face toward the interior of the lower cavity 20, such bends or flexures also providing valleys between such ridges. The ridges 145, 147 and 148 in their horizontal and vertical dimensioning respectively correspond to the ridges 25, 27 and 28 in FIG. 4. As a difference, however, in FIG. 6 the ridges bounding cavity 20 are on its upper side whereas in FIG. 4 they are on its lower side. Otherwise, the lower cavity 20 is of the same configuration in FIG. 6 as it is in FIG. 4, and the upper cavity 30 is of the same configuration in both those figures.

Upper sheet metal plate 135 is shaped by, say, stamping to have at its periphery, first, a cylindrical flange 150 vertically upstanding from the reference plane for the plate and, second, an annular rim 151 integral with and horizontally projecting radially outward of the outer (i.e., upper) margin of flange 150. A plurality of vertical bolts 152 are spaced equiangularly around rim 151 and pass up through holes therein into threaded holes in top end plate 130 to fasten the plates 130 and 135 together.

Analogously, lower sheet metal plate 136 is shaped to have at its periphery a cylindrical flange 153 downstanding from the plate's reference plane and, also, an annular rim 154 integral with and horizontally projecting radially outward of, flange 153 at its bottom. A plurality of vertical bolts 155 are spaced equiangularly around rim 154 and pass down through holes therein into threaded holes in bottom end plate 131 to fasten together the plates 131 and 136.

The two end plates 131 and 132 are held spaced apart by a plurality of arcuate sleeve segments 156 vertically disposed between rim 154 of plate 136 and the underside of plate 130 and angularly distributed around the periphery of rim 154 in interspersed relation with the bolts 155. The assembly of plates 130, 135 and the assembly of plates 131, 136 are fastened together by the bolts 71 and 79 which are shown in FIGS. 2 and 4 (although not in FIG. 6) and which, in the FIG. 6 modification, pass through holes in plate 130 (in the case of bolts 71) and through holes in the plate 131 and rim 154 (in the case of bolts 79) and, from there, into threaded receptacle holes therefor (not shown) formed in the sleeve segments 156. At least two bolts 71 and two corresponding bolts 79 are received in angularly spaced ones of such threaded holes in each of sleeve segments 156.

The amplifier modules 40 are coupled to the upper divider cavity 30 and the lower combiner cavity 30 by, respectively, the input coaxial connector units 160 and the output coaxial connector units 161. Units 160 and 161 correspond, respectively, to the input and output couplers 433 and 435 of FIG. 4 but have the structures which are disclosed for such coaxial connector units in the aforementioned Bacher et al patent application. As shown in FIG. 6, the output units 161 are disposed radially outward of the peripheral wall surrounding divider cavity 30, and those units 161 do not pass through any portion of the cavity bounding means for that upper cavity.

The retraction of the bolts 71 and 79 from their threaded holes in sleeve segments 156 permits the plate assembly 130, 135 and the plate assembly 131, 136 to be detached from each other to permit the cavities 30 and 20 respectively enclosed thereby to be separately tested. Further, the providing in FIG. 6 for the cavities 30 and 20 of the described alternations of concentric ridges and valleys by the use of thin inflected sheet metal plates 135, 136 rather than by thick milled plates (as in FIG. 4) is an improvement which saves the very considerable expense of utilizing milling to create the appropriate configurations for the cavities.

Still further, in the cavity closure means shown in FIG. 6, each of the two end plates 130 and 131 for such closure means may be conveniently extended, unimpeded, horizontally outward in all directions away from the outside of the peripheral wall of the cavity associated with that end plate. Thus, while plates 130, 131 have been earlier described as being circular, they can also be square in outline if that is convenient. Moreover, the plates 130 and 131 can horizontally extend far enough outward of the rims 151, 154 of the sheet metal plates 13, 136 attached thereto that those rims are completely surrounded by the surfaces 132 and 133 of the plates 130, and 131. Such ability to enlarge unimpeded the horizontal dimensioning of the end plates 130, 131 relative to that of cavities 30 and 20 provides the advantage that more room can be made to mount components on those plates, and such plates can be extended to connect them to other structures as, say, housing means for the apparatus shown in FIG. 6.

It is, of course, desirable that the cavities 30 and 20 have dimensional stability in order that they not become inadvertently detuned. In the event that the natural rigidity of the sheet metal plates 135, 136 falls short of assuring the desired degree of dimensional stability of the cavities, further stiffness can, in effect, be imparted to the plates 135, 136 by the use of cylindrical spacer sleeves 170 and 171 of dielectric material. Sleeve 170 is joined to the underside of end plate 130 and is disposed in, and in coaxial relation with, cavity 30 to be interposed between the metallic wall portions bounding the vertically opposite sides of that cavity. Similarly, sleeve 171 is joined to the upper side of plate 131, and in coaxial relation with, cavity 20 to be interposed in that cavity between the metallic wall portions bounding the vertically opposite sides of the latter cavity. The sleeves 170 and 171 dimensionally stabilize the cavities 30 and 20 to the extent that they prevent the central ridges 143 and 148 of the sheet metal plates 135 and 136 from approaching closer than a fixed minimum distance to the portions vertically opposite those ridges of the plates 130 and 131. In this way, the cavities 30 and 20 are stabilized against deformation in one vertical direction of the plates 135 and 136 away from their normal positioning in relation to plates 130 and 131.

It is, also, however often desirable for the cavities to be stabilized against deformation of the plates 135 and 136 in the other vertical direction. This is done in the FIG. 6 modification by inserting in the cavity closure means between the sheet metal plates 135, 136 another cylindrical resilent sleeve 180 disposed coaxial with the cavities 30, 20 and the spacer sleeves 170 and 171. Such resilient sleeve may be joined either to the plate 135 or the plate 136.

The sleeve 180 is designed to act as a compression spring and, in fact, may be replaced in practice by a stiff conventional helical compression spring.

When sleeve 180 is inserted between sheet metal plates 135, 136 as shown in FIG. 6, and the plate assemblies 130, 135 and 131, 136 are then fastened together as earlier described, the sleeve 180 is vertically incrementally deformed to be put in a state of compressive strain and, thereby, to exert on the plates 135 and 136 oppositely directed resilient forces which urge these plates towards, respectively, the spacer 170 and the spacer 171. As a result of such urging, the sheet metal plates 135 and 136 are held or maintained at spacings from the end plates 130, 131 established by the spacers 170 and 171.

There may be instances in which it may be desirable to have the capability of adjusting the spacings between the plates 130 and 135 and between the plates 131 and 136 in order to adjust the tuning of the cavities 30 and 20. For that purpose, the sleeve 180 is preferably replaced by the mentioned stiff helical compression spring, and the sleeves 170 and 171 are replaced by screws (not shown) of dielectric material passing vertically through threaded holes (not shown) in plates 130, 131 radially offset from the axis of cavities 30, 20, the screws then extending down beyond these holes to contact by the screws' front ends the center ridges 143 and 148 of the sheet metal plates 135 and 136. By turning such dielectric screws in such holes the spacing between the plates 130, 135 and between the plates 131 and 136 may be selectively adjusted to produce an adjustment in the frequency response curves of the cavities 30 and 20.

Figure 9:
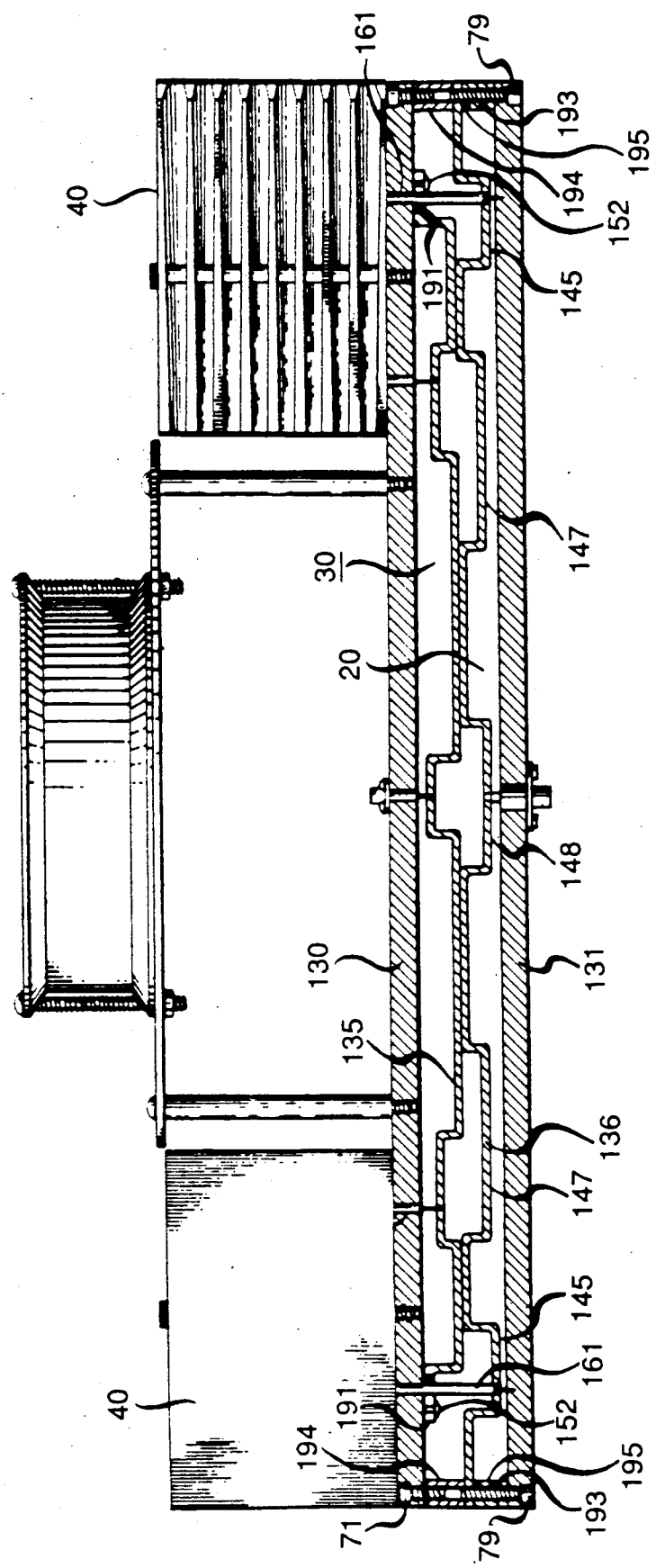
FIG. 9 is a view in vertical cross section of a further modification of the FIG. 6 cavity closure means.
Figure 10:
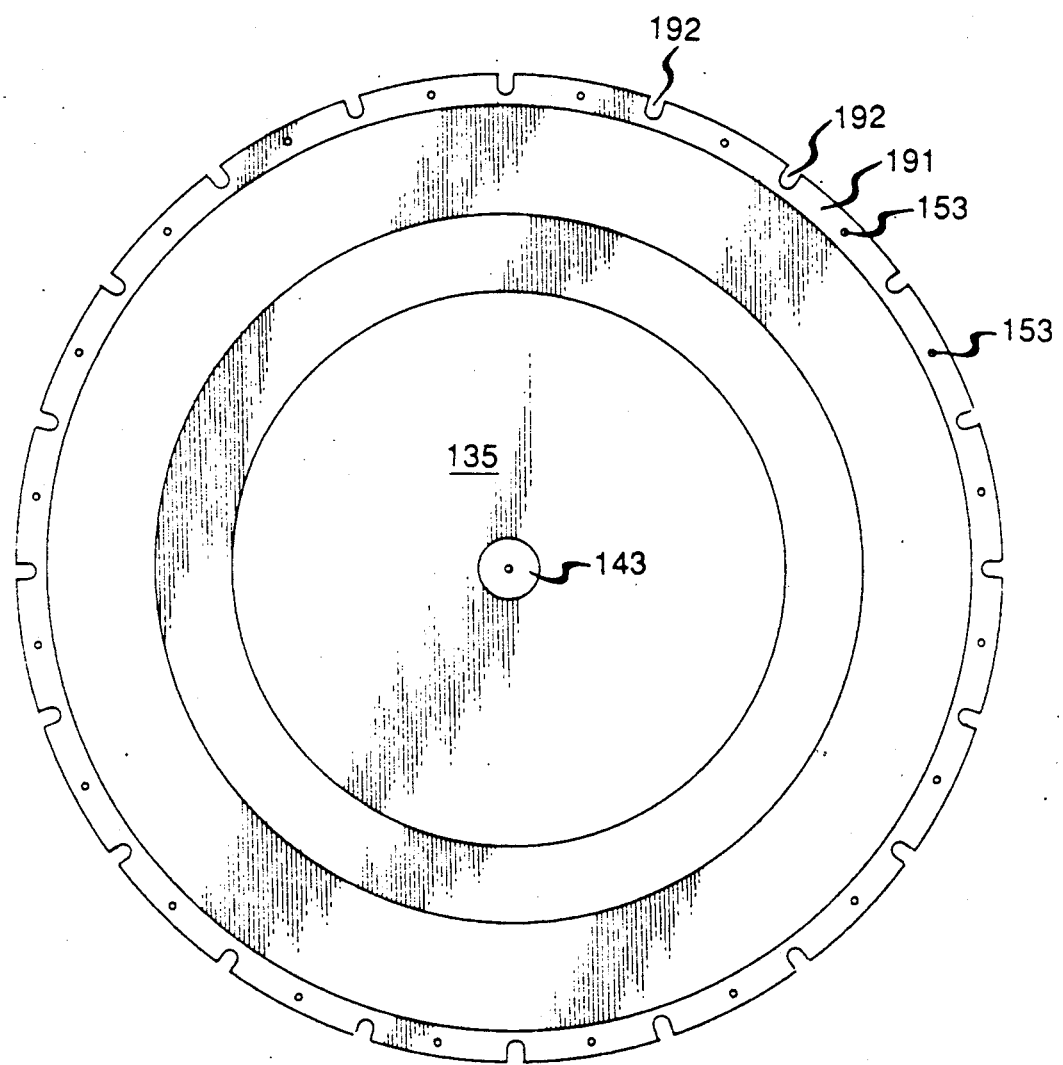
FIG. 10 is a plan view of the upper one of the sheet metal plates of the FIG. 6 cavity closure means as modified in accordance with FIG. 9.

FIG. 9 shows a variant of the FIG. 6 embodiment. In the FIG. 9 variant, the sheet metal plate 135 has an outer rim 191 of greater radial width than the rim 151 for that plate shown in FIG. 6. The circumferential edge of rim 191 is disposed radially outward of the positions of the output coaxial connector units 161 for the amplifier units 40. In order, therefore, to permit such units to vertically pass by plate 135, its rim 191 has formed thereon a set of equiangularly spaced notches 192 (FIG. 10) alternating with holes 153 for passage through plate 135 of the bolts 152 which fasten it to end plate 130. The units 161 are radially and angularly positioned centrally within those notches 192 so as to be able to pass freely by the plate 135.

Another difference of the FIG. 9 variant from the FIG. 6 apparatus is that in FIG. 9 the lower sheet metal plate 136 lacks at its periphery the downturned flange 153 and radially out-turned flange rim 154 shown in FIG. 6. Instead, in FIG. 9 the plate 136 remains flat in its reference plane radially outward all the way from its ridge 145 to the circumferential edge of the plate.

The plate 136 has bordering that edge an annular portion 193 disposed vertically between and contacted by two vertically superposed coaxial cylindrical sleeves 194 and 195 interposed between the end plates 130 and 131. As in FIG. 4, the bolts 71 pass down through holes in plate 130 and into threaded holes in sleeve 194 to fasten that plate and sleeve together. Also as in FIG. 4, the bolts 79 pass up through holes in each of plate 131, sleeve 195 and plate 136, and then into the threaded holes in sleeve 194 to fasten the assembly of elements 131, 195, 136 with the assembly of elements 194, 130. In the resulting structure, the stacked sleeve 195, annular plate portion 193 and sleeve 194 serves to hold the plates 130, 131, 136 spaced apart as illustrated.

Figure 11:
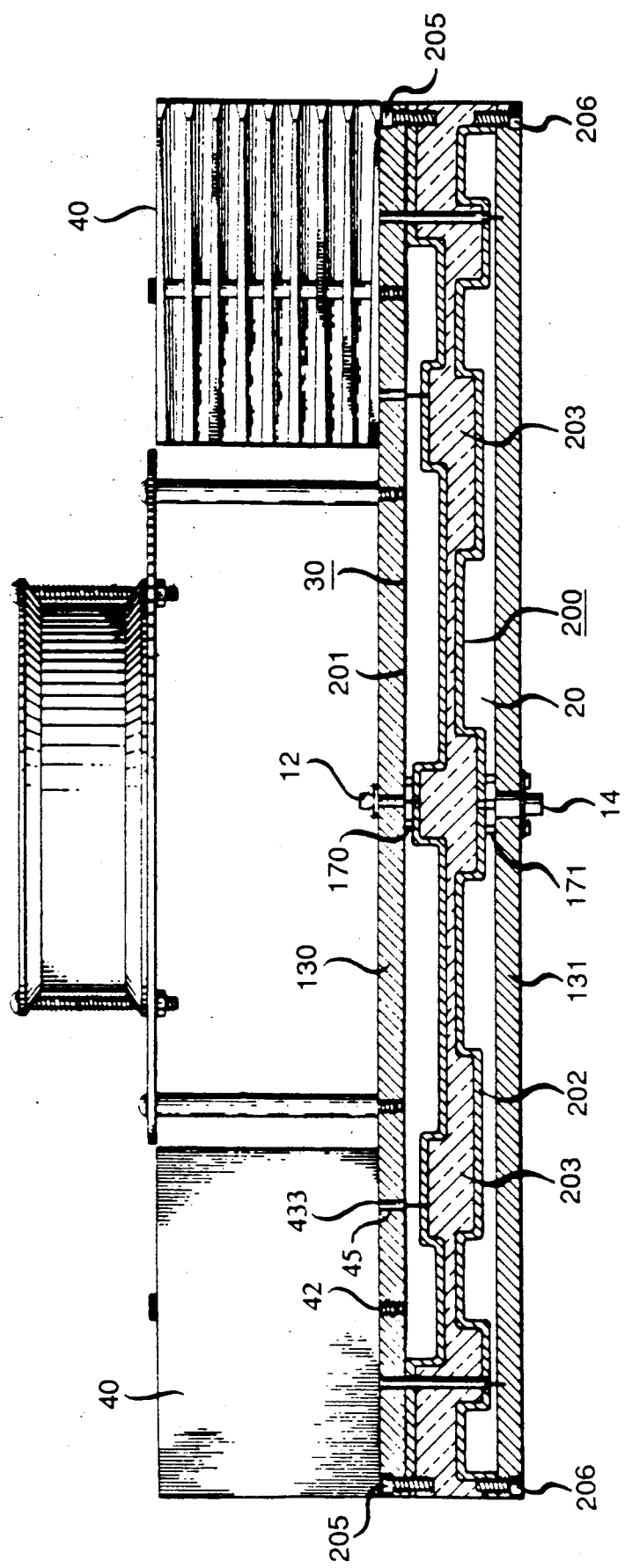
FIG. 11 is a view in vertical cross section of cavity closure means including a single composite plate adapted to replace the two sheet metal plates shown in the FIG. 6 cavity closure means.

FIG. 11 shows a variant of the FIG. 6 embodiment in which the top and bottom wall means of the cavity closure means are provided, as before, by the top and bottom flat end plates 130 and 131, but in which the central wall means for such closure means is a single composite plate 200. That plate comprises claddings 201, 202 of metallic material on vertically opposite sides of a substrate therefor in the form of a molded disc 203 of plastic material. Plate 200 incorporates discontinuities therein between the metallic material of claddings 201, 202 and the plastic material of disc 203. The claddings 201, 202 are deposited on the disc 203 by electroforming or in some other conventional manner. Each of such claddings constitutes a laminate body of metallic material bounding the one of cavities 30 and 20 adjacent thereto to provide a metallic wall portion for the near vertical side of that cavity. As shown in FIG. 11, the opposite sides of disc 203 are shaped in the course of its molding to impart to the upper cladding 201 and to the lower cladding 202 the same concentric ridges and valleys for, respectively, the cavity 30 and the cavity 20 as are depicted in FIGS. 4 and 6. The entire composite plate 200 may be fastened as shown in FIG. 11 by bolts 205, and 206 to, respectively, the upper and lower end plates 130 and 131 so as to hold these end plates in spaced apart relation.

The FIG. 11 variant is advantageous in circumstances where it is cheaper to provide the described ridges and valleys for the cavities 30 and 20 by plastic molding of a substrate and subsequent metallic cladding thereof then it is to provide such ridges and valleys in some other way.

Figure 12:
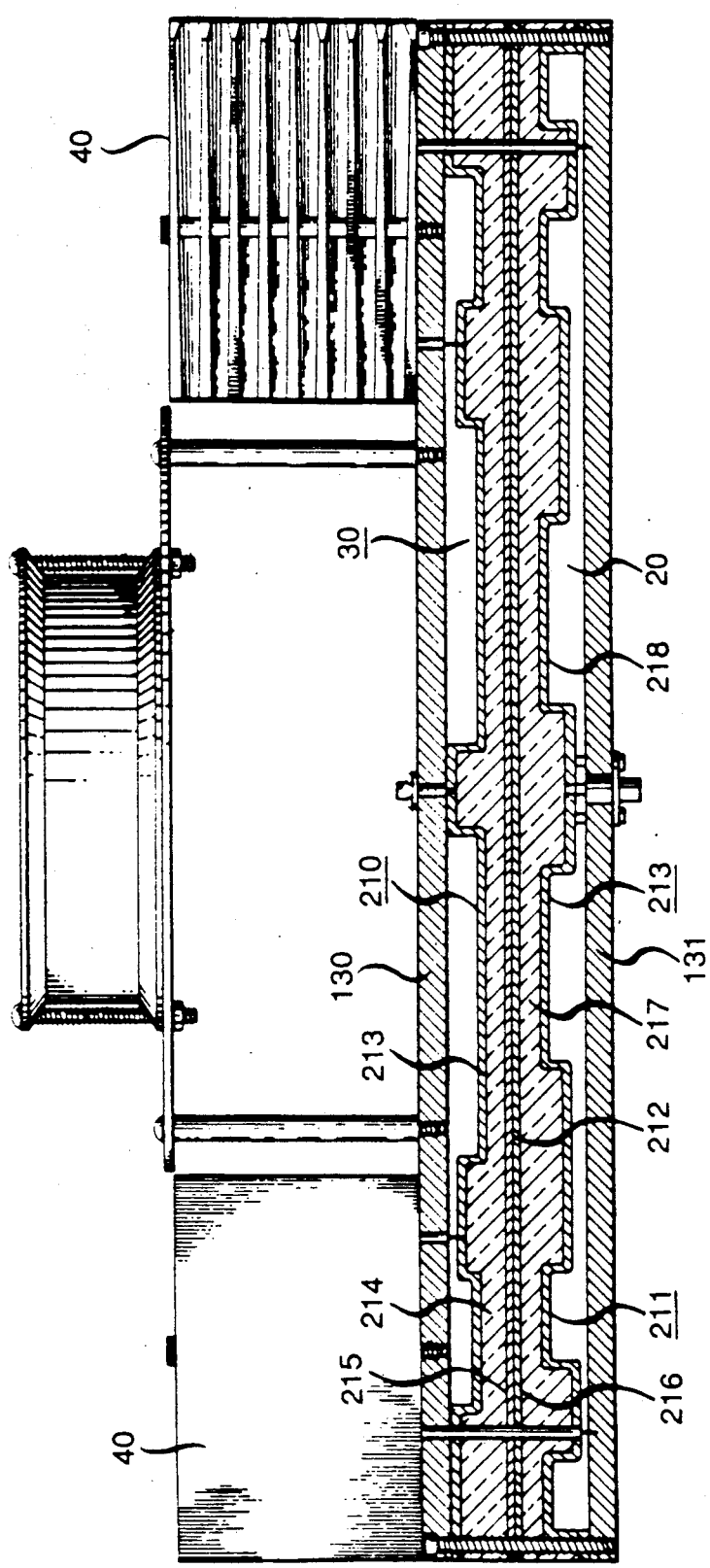
FIG. 12 is a view in vertical cross section of cavity closure means including two composite plates to replace the two sheet metal plates shown in the FIG. 6 cavity closure means.

FIG. 12 shows a variant of the FIG. 6 embodiment in which, as in FIG. 11, the central wall means for the cavity closure means is a composite means but in which, as distinct from FIG. 11, such central wall means comprises two composite plates.

To wit, in FIG. 12 the mentioned central wall means comprises upper and lower composite plates 210, 211 in contact with each other at a spatial discontinuity 212 between them. The upper composite plate 210 comprises an outer sheet metal plate 213 bounding the bottom side of cavity 30, a backing for such plate in the form of a plastic disc 214, and an inner metallic support plate 215 on the bottom side of disc 214 and reinforcing the stiffness of composite plate 210. The lower composite plate 210 similarly comprises an inner metallic support plate 216 on top of a plastic disc 217 providing a backing for an outer sheet metal plate 218 on the bottom of such disc and bounding the upper side of the cavity 20. In each of the described composite plates, the two metallic plates thereof are bonded to or otherwise united with the central plastic disc of the plate. Further, in each of the two composite plates the outer metallic plate and the surface contacting that plate of the disc are both configured to present to the adjacent one of cavities 30 and 20 the same alternation of concentric ridges and valleys as are shown in FIGS. 4 and 6. The inner metallic plates 215 and 216 of the composite plates 210 and 211 are, as shown, flat plates in flush contact with each other on opposite sides of discontinuity 212.

The composite plates 210, 211 are held coaxial with each other by a set of bolts 220 passing through equiangularly spaced registering vertical holes in plates 130, 210, and 211 and then into threaded holes formed in the lower end plate 131. When the bolts 220 are tightened in the last-named holes, the superposed composite plates 210 and 211 maintain the end plates 130 and 131 in predetermined spaced apart relation.

If desired, the sheet metal plate components of composite plates 213, 218 may be replaced by claddings of metallic material deposited on the outer surfaces of the plastic discs 214 and 217.

Among the advantages of the FIG. 12 arrangement are the following. First, the inclusion in the composite plates 210, 211 of the plastic discs and support plates makes those composite plates much stiffer than would be the sheet metal plates alone. Hence, the possibility of detuning cavities 30 and 20 by unwanted deformation of the sheet metal plates is minimized. Second, the plastic discs 214, 217 have their ridge and valley contours imparted thereto by molding an only one side of the disc as compared to the FIG. 11 case where such contours are realized with less ease by molding the plastic disc 203 on both of its sides. Third, in the FIG. 12 case (as in that of FIG. 11), the composite means between cavities 30 and 20 serves of itself to properly space apart the end plates 130 and 131.

The above described improvements being exemplary only, it is to be understood that additions thereto, omissions therefrom and further modifications thereof can be made without departing from the spirit of the invention. For example, the composite plates of FIG. 12 may be altered by removing the plastic discs thereof so that each such plate includes as plate components only its sheet metal plate and the associated flat support plate abutting the back of the sheet metal plate and fastened thereto by welding or in some other appropriate manner.

Accordingly, the invention is not to be considered as limited save as is consonant with the recitals of the following claims.

I claim:

1. The improvement in divider-combiner microwave amplifying apparatus comprising: cavity closure means comprising vertically spaced top and bottom wall means and central wall means therebetween, horizontally extending upper and lower substantially coaxial cavities substantially circular in horizontal cross section and vertically interposed between said central wall means and, respectively, said top and bottom wall means so that vertically opposite sides of each of such cavities are bounded by metallic wall portions provided by said plurality of wall means, with such central means providing two such portions respectively bounding said upper and lower cavities, said cavities each permitting horizontal propagation therethrough of electromagnetic wave energy radially between a central port for such cavity and points radially outward of and angularly distributed around such port, a plurality of amplifier modules mounted on and distributed around such closure means, and a plurality of coaxial connector units coupling each of said modules at said points to each of said cavities for transfer of an input of said energy from one of said cavities to said modules and from said modules to the other of said cavities to provide therefrom an output of such energy as amplified; and said improvement being that said central wall means incorporates therein a horizontally extending discontinuity which is vertically interposed between the metallic wall portions of such central wall means which respectively bound said upper and lower cavities so that such two metallic wall portions are non-integral with each other.

2. The improvement according to claim 1 in which each of said metallic wall portions of said central wall means is provided by a cladding of metallic material, each such cladding is on a substrate means therefor of plastic material disposed vertically between that wall portion and the other of such wall portions, and in which said discontinuity comprises a discontinuity of material between said metallic material of said claddings and said plastic material.

3. The improvement according to claim 2 in which said central wall means comprises a plate comprising a horizontally extending disc of plastic material and claddings of metallic material on vertically opposite sides of such disc.

4. The improvement according to claim 1 in which said discontinuity comprises a spatial discontinuity, and in which said central wall means comprises first and second vertically-superposed horizontally-extending plate means on vertically opposite sides of such spatial discontinuity, said first and second plate means providing said respective metallic wall portions of such wall means which bound respectively the bottom and top sides of, respectively, said upper and lower cavities.

5. The improvement according to claim 4 in which said first and second plate means are contiguous with each other.

6. The improvement according to claim 4 in which said first and second plate means are spaced apart from each other.

7. The improvement according to claim 4 in which said first plate means and said upper cavity are smaller in horizontal dimension than said second plate means and lower cavity, and in which said amplifier modules are coupled to said lower cavity by coaxial connector units disposed horizontally outward of said first plate means and extending from said modules to such cavity.

8. The improvement according to claim 4 in which the periphery of said first plate means and the top of said second plate means bound adjacent sides of a notch of generally "L" shape in vertical cross section and extending horizontally around said cavity closure means below the top thereof, said amplifier modules have feet extending down into said notch to be seated on the top of said second plate means, and said modules are coupled to said lower cavity by coaxial connector units extending down from said feet.

9. The improvement according to claim 4 in which at least one of the metallic wall portions of, respectively, said first and second plate means which bound, respectively, said upper and lower cavities comprises a horizontally extending laminate body of metallic material which is of constant thickness between its opposite sides and which diverges in the radial direction away from the horizontal to have formed therein an alternation of ridges and valleys concentric with each other.

10. The improvement according to claim 9 in which said body of metallic material is provided by the material of a sheet metal plate which is inflected by machine working to provide said ridges and valleys.

11. The improvement according to claim 10 in which the one of said cavities which is bounded on one vertical side thereof by said sheet metal plate contains spacer means of dielectric material interposed between such plate and the metallic wall portion bounding the other vertical side of such cavity, said spacer means being adapted to maintain a minimum spacing between such plate and such last-named portion.

12. The improvement according to claim 11 in which said cavity closure means includes resilient means urging said sheet metal plate towards said spacer means so as to maintain at said minimum spacing the separation between said plate and portion.

13. The improvement according to claim 10 in which said sheet metal plate has a backing therefor formed of plastic material.

14. The improvement according to claim 10 in which said sheet metal plate is reinforced by a metallic support plate disposed to one side of said sheet metal plate and coupled thereto.

15. The improvement according to claim 10 in which said sheet metal plate is reinforced by a metallic support plate disposed to one side and coupled to said sheet metal plate, and in which said sheet metal plate has a rigid backing therefor formed of plastic material and interposed between said sheet metal plate and said support plate.

16. The improvement in divider-combiner microwave amplifying apparatus comprising: cavity closure means enclosing vertically-spaced horizontally-extending substantially coaxial upper and lower cavities each substantially circular in horizontal cross section, and each permitting horizontal propagation therethrough of electromagnetic wave energy radially between a central port for said cavity and points radially outward of and angularly distributed around such port, said upper cavity being radially smaller than said lower cavity, a plurality of radially extending amplifier modules mounted on, and angularly distributed in carousel fashion around, said closure means, and a plurality of coaxial connector units coupling each of said modules at said points to each of said cavities for transfer of an input of said energy from one of said cavities to said modules and from said modules to the other of said cavities to provide therefrom an output of said energy as amplified; said improvement being that said cavity closure means includes a circumferential portion thereof extending around the periphery of said upper cavity and having an outer surface radially inward of the periphery of said lower cavity, and in which said amplifier modules are coupled to said lower cavity by coaxial connector units disposed in the radial direction outward of said outer surface of said circumferential portion and inward of said periphery of said lower cavity.

17. The improvement in divider-combiner microwave amplifying apparatus comprising: cavity closure means enclosing vertically-spaced horizontally-extending substantially coaxial upper and lower cavities each substantially circular in horizontal cross section, and each permitting horizontal propagation therethrough of electromagnetic wave energy radially between a central port for said upper cavity and points radially outward of and angularly distributed around such port, said upper cavity being radially smaller than said lower cavity, a plurality of radially extending amplifier modules mounted on, and angularly distributed in carousel fashion around, said closure means, and a plurality of coaxial connector units coupling each of said modules at said points to each of said cavities for transfer of an input of said energy from one of said cavities to said modules and from said modules to the other of said cavities to provide therefrom an output of said energy as amplified; said improvement being that said cavity closure means has formed in its exterior an annular indentation extending around such closure means below its top and at least partly bounded by a circumferential portion of such closure means extending around said upper cavity and by an annular portion of said closure means covering said lower cavity, said amplifier modules at their front and rear ends overlie, respectively, the top of such closure means and said annular portion, said modules at their rear ends have projections extending vertically down below said top into said indentation towards such annular portion, and said coaxial connector units extend down from such module projections through said annular portion to said lower cavity.

18. The improvement according to claim 17 in which said indentation is a notch of generally "L" shape in vertical-radial cross section, said modules at their front ends are seated on the top of such cavity closure means, and said module projections are in the form of feet extending down into said notch to said annular portion to be sealed thereon.

19. The improvement in divider-combiner microwave amplifying apparatus comprising: cavity closure means comprising vertically spaced top and bottom wall means of which at least one is a horizontally extending metallic plate, central wall means vertically between said top and bottom wall means, and horizontally-extending microwave-conducting upper and lower cavities vertically interposed between said central wall means and, respectively, said top and bottom wall means, said improvement being that said cavity closure comprises circumferential wall means horizontally extending around the periphery of at least one of said cavities and vertically extending to a region of adjacency with said plate, and that said circumferential wall means is disposed horizontally inward of the circumference of said plate so as to leave uncovered by such circumferential wall means a surface portion of said plate horizontally outward of said circumferential wall means.

20. The improvement as in claim 19 in which each of said top and bottom wall means is a horizontally extending metallic plate, said circumferential wall means horizontally extends around the respective peripheries of both said upper and lower cavities and vertically extends to regions of adjacency with, respectively, one and the other of said plates, and in which said circumferential wall means is disposed horizontally inward of the circumferential margins of both said plates so as to have uncovered by such means a surface portion of each such plate disposed horizontally outward of said circumferential wall means.

21. The improvement in divider-combiner microwave amplifying apparatus comprising: cavity closure means comprising, vertically spaced top and bottom wall means and central wall means therebetween, horizontally extending upper and lower substantially-coaxial microwave-conducting cavities substantially circular in horizontal cross section and vertically interposed between said central wall means and, respectively, said top and bottom wall means so that vertically opposite sides of each of such cavities are bounded by metallic wall portions provided by said plurality of wall means, with such central wall means providing two such portions on vertically opposite sides of such means and respectively bounding said upper and lower cavities; and said improvement being that each of such two metallic wall portions of such central wall means has a surface bounding the one of such cavities adjacent that portion, and that such surface is characterized by an alternation in the radial direction of ridges and valleys concentric with each other.

22. The improvement according to claim 21 in which each of such metallic wall portions of, respectively, such top and bottom wall means bounds the one of such cavities adjacent that portion by a surface of such portion which is substantially flat.

23. The improvement in divider-combiner microwave amplifying apparatus comprising: cavity closure means comprising vertically spaced top and bottom wall means and central wall means therebetween, and horizontally extending microwave-conducting upper and lower cavities vertically interposed between said central wall means and, respectively, said top and bottom wall means, so that said upper cavity is bounded on its top and bottom sides by, respectively, said top wall means and said central wall means, while said lower cavity is bounded on its top and bottom sides by, respectively, said central wall means and said bottom wall means, said improvement being that at least one of such three wall means is at least partly constituted of horizontally-extending laminate metallic material bounding a vertical side of one of said cavities and of constant thickness between opposite sides of such material, said material having inflections from the horizontal formed therein so as to impart to such last-named wall means a configuration of concentric ridges and valleys facing towards that cavity.

24. The improvement according to claim 23 in which said laminate metallic material comprises a cladding of such material on substrate means.

25. The improvement according to claim 23 in which said laminate metallic material is provided by a sheet metal plate.

26. The improvement in divider-combiner microwave amplifying apparatus comprising: cavity closure means comprising vertically spaced top and bottom wall means and central wall means therebetween, and horizontally extending microwave-conducting upper and lower cavities interposed between said central wall means and, respectively, said top and bottom wall means, said improvement being that said central wall means comprises first and second vertically superposed sheet metal plates bounding the bottom and top sides of, respectively, said upper cavity and said lower cavity and that at least one of such sheet metal plates has inflections therein forming in such plate an alternation of ridges and valleys concentric with each other and facing toward the cavity bounded by such plate.

27. The improvement according to claim 26 in which both of such sheet metal plates are characterized by such an alternation of ridges and valleys concentric with each other.

28. The improvement according to claim 26 in which said sheet metal plates are vertically spaced from each other.

29. The improvement according to claim 26 in which said sheet metal plates are in contiguous back-to-back relation with each other.

30. The improvement according to claim 26 in which said improvement further comprises at least one dielectric spacer means disposed in at least one of said cavities between the sheet metal plate bounding one vertical side of that cavity and the opposite vertical side thereof, said spacer means being adapted to maintain a minimum spacing between such plate and such opposite side.

31. The improvement according to claim 30 in which each of said upper and lower cavities contains such a dielectric spacer means.

32. The improvement according to claim 30 in which said cavity closure means comprises resilient means urging such sheet metal plate towards said spacer means.

33. The improvement according to claim 26 in which at least one of said top and bottom wall means comprises a metallic end plate, and in which the one of said sheet metal plates nearest that end plate has formed therein a peripheral flange vertically extending toward said end plate and, moreover, a rim for such flange extending horizontally outward from the margin thereof at the free end of such flange, said rim being mechanically coupled to said end plate.

34. The improvement according to claim 33 in which each of said top and bottom wall means comprises a metallic end plate.

35. The improvement according to claim 34 in which each of said sheet metal plates is characterized by a peripheral vertically extending flange and by a rim therefor extending outward from the free end of such flange, each of such sheet metal plates being mechanically coupled at such rim thereof to the nearer metallic end plate.

36. The improvement according to claim 34 in which said improvement further comprises vertically extending sleeve means surrounding said cavities and adjacent at its top and bottom to, respectively, the top one of such end plates and the bottom one thereof.

37. The improvement according to claim 25 in which said sheet metal plate is backed by substrate means of plastic material.

38. The improvement according to claim 25 in which said sheet metal plate is reinforced by a metallic support plate therefor.

39. The improvement according to claim 25 in which said sheet metal plate is backed by substrate means of plastic material and is reinforced by a metallic support plate therefor.

40. The improvement in divider-combiner microwave amplifying apparatus comprising: cavity closure means defining therein upper and lower divider and combiner cavities each generally in the form of a cylindrical disc having a vertical axis and extending radially outward from said axis, said closure means comprising, for each of said cavities, a pair of vertically spaced metallic wall means respectively bounding the top and bottom of that cavity, and said improvement comprising: cavity tuning means changeable to various settings thereof and effective by changing the setting thereof for adjusting for at least one of said cavities the vertical spacing between the two metallic wall means bounding the top and bottom of such cavity to thereby vary the tuning thereof.

41. The improvement according to claim 40 in which such adjusting means comprises means imparting deformability in the vertical direction to at least one of said two vertically spaced wall means bounding said last-named cavity, and means for forcibly displacing said one wall means to cause deformation thereof so as to adjust the vertical spacing between such two wall means.

42. The improvement according to claim 41 in which said displacing means comprises a screw of dielectric material passing through a threaded hole in one of said two wall means and through said such cavity to have a front part of such screw bear against the other of said two wall means, said screw being adapted by rotation thereof in said hole to produce such forcible displacement.

* * * * *